(12) United States Patent
Lu

(10) Patent No.: US 9,859,930 B2
(45) Date of Patent: Jan. 2, 2018

(54) MULTI-PATH LOW-NOISE AMPLIFIER AND ASSOCIATED LOW-NOISE AMPLIFIER MODULE AND RECEIVER

(71) Applicant: MEDIATEK INC., Hsin-Chu (TW)

(72) Inventor: Ying-Tsang Lu, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/199,948

(22) Filed: Jun. 30, 2016

(65) Prior Publication Data

US 2017/0047956 A1 Feb. 16, 2017

Related U.S. Application Data

(60) Provisional application No. 62/203,493, filed on Aug. 11, 2015.

(51) Int. Cl.
H04B 1/10 (2006.01)
H04B 1/12 (2006.01)
H03F 3/68 (2006.01)
H04B 1/00 (2006.01)
H04L 5/00 (2006.01)
H04L 27/26 (2006.01)
H03F 1/26 (2006.01)
H03F 3/19 (2006.01)
H03F 3/21 (2006.01)

(52) U.S. Cl.
CPC .............. *H04B 1/12* (2013.01); *H03F 1/26* (2013.01); *H03F 3/19* (2013.01); *H03F 3/211* (2013.01); *H03F 3/68* (2013.01); *H04B 1/005* (2013.01); *H04L 5/001* (2013.01); *H04L 27/2647* (2013.01); *H03F 2200/294* (2013.01); *H03F 2200/318* (2013.01); *H03F 2200/372* (2013.01); *H03F 2200/451* (2013.01)

(58) Field of Classification Search
CPC ... H04B 1/10; H04B 1/12; H04B 1/16; H04B 1/005; H03F 1/26; H03F 3/19; H03F 3/211; H03F 3/68; H03F 2200/294; H03F 2200/318; H03F 2200/372; H03F 2200/451

See application file for complete search history.

(56) References Cited

U.S. PATENT DOCUMENTS

| 8,503,967 | B2 | 8/2013 | Liao | |
|---|---|---|---|---|
| 9,300,420 | B2 | 3/2016 | Chang et al. | |
| 2007/0032976 | A1* | 2/2007 | Rzyski | G01R 29/26 702/111 |
| 2008/0096516 | A1* | 4/2008 | Mun | H03F 1/26 455/341 |
| 2010/0261438 | A1 | 10/2010 | Walley | |
| 2013/0057346 | A1 | 3/2013 | Riekki | |
| 2014/0134959 | A1 | 5/2014 | Tasic | |
| 2014/0170999 | A1 | 6/2014 | Aparin | |
| 2014/0355728 | A1 | 12/2014 | Liao | |
| 2015/0180694 | A1 | 6/2015 | Bellaouar | |
| 2016/0329976 | A1* | 11/2016 | Leung | H03F 1/0205 |

* cited by examiner

*Primary Examiner* — Nguyen Vo
(74) *Attorney, Agent, or Firm* — Winston Hsu

(57) ABSTRACT

A receiver is provided to support a plurality of carrier aggregation modes. The receiver includes a low-noise amplifier (LNA) module including a plurality of LNAs, wherein the LNAs are arranged to receive input signals from a plurality of input ports, respectively, and each of the LNAs generates and outputs a plurality of noise-cancelled signals at a plurality of output terminals of the LNA module.

21 Claims, 5 Drawing Sheets

MULTI-PATH LOW-NOISE AMPLIFIER AND ASSOCIATED LOW-NOISE AMPLIFIER MODULE AND RECEIVER

CROSS REFERENCE TO RELATED APPLICATIONS

This application claims the priority of U.S. Provisional Application No. 62/203,493, filed on Aug. 11, 2015, which is included herein by reference in its entirety.

BACKGROUND

In the Long Term Evolution (LTE) standard, carrier aggregation is used in order to increase the bandwidth, where the carrier aggregation comprises several operation modes such as intra-band continuous/non-contiguous carrier aggregation and inter-band carrier aggregation. Therefore, a receiver is required to support all the carrier aggregation operation modes. The receiver usually suffers from noise degradation when operating in some operation modes such as the non-contiguous carrier aggregation mode, a noise-cancellation technique is a good candidate to improve the performance by performing the noise cancellation upon the signal. Hence, a circuit design to satisfy the aforementioned requirements is an important topic.

SUMMARY

It is therefore an objective of the present invention to provide a multi-path low-noise amplifier and associated low-noise amplifier module and receiver, which can flexibly amplify selected radio frequency (RF) input signals and pass the amplified RF input signals into following mixers, and a plurality of noise-cancellation path are used to cancel some portion of noise upon the amplified RF signals, to solve the above-mentioned problems.

According to one embodiment of the present invention, a receiver is disclosed. The receiver comprises a low-noise amplifier (LNA) module comprising a plurality of LNAs, wherein the LNAs are arranged to receive input signals from a plurality of input ports, respectively, and each of the LNAs generates and outputs a plurality of noise-cancelled signals at a plurality of output terminals of the LNA module.

According to another embodiment of the present invention, a LNA module of a receiver comprises a plurality of LNAs, wherein the LNAs are arranged to receive input signals from a plurality of input ports, respectively, and each of the LNAs generates and outputs a plurality of noise-cancelled signals to a plurality of output terminals of the LNA module.

According to another embodiment of the present invention, a LNA for receiving an input signal to generate a plurality of noise-cancelled signals is disclosed. The LNA comprises a plurality of main amplifiers, a matching circuit and a plurality of combiners. Each of the main amplifiers is selectively enabled to receive the input signal to generate an amplified signal; The matching circuit is arranged for providing input matching and further receiving the input signal. The plurality of combiners are respectively coupled to the main amplifiers, wherein each of the combiners is arranged to combine the corresponding amplified signal, if any, with an output of the matching circuit to generate the corresponding noise-cancelled signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
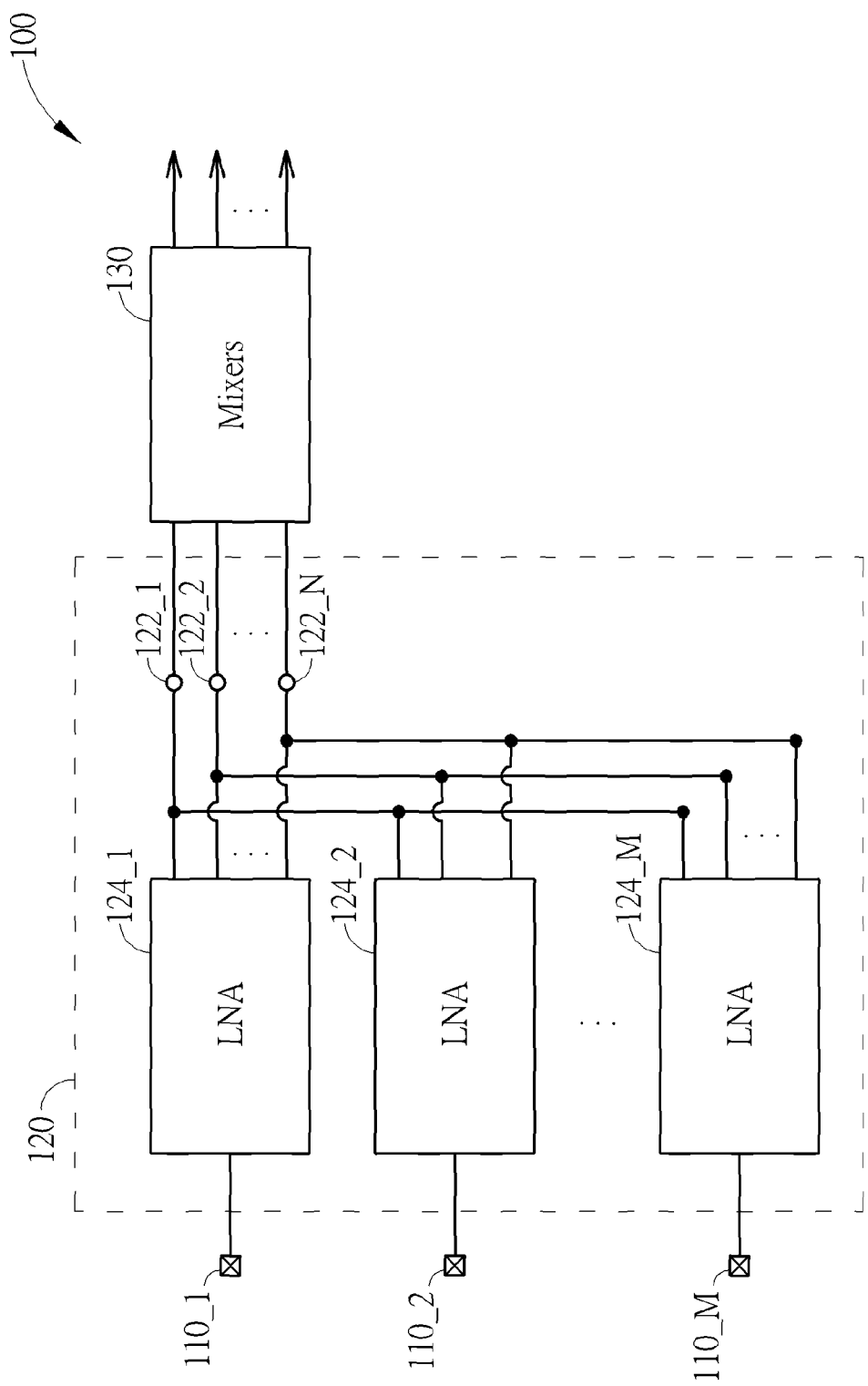
FIG. 1 is a diagram illustrating a receiver according to one embodiment of the present invention.

Please refer to FIG. 1, which is a diagram illustrating a receiver 100 according to one embodiment of the present invention. As shown in FIG. 1, the receiver 100 comprises a plurality of RF input ports 110_1-110_M, a LNA module 120 and mixers 130, where the LNA module 120 comprises a plurality of LNAs 124_1-124_M and a plurality of output terminals 122_1-122_N. The quantity of the LNAs and the output terminals of the LNA module 120 (i.e. values of M and N) can be any appropriate number, for example, M may be 8 while N may be 3.

In this embodiment, the RF input ports 110_1-110_M are arranged to receive input signals from an antenna front-end module, respectively, where the input signals may belong to different standards and/or different specifications. The LNAs 124_1-124_M are arranged to receive the input signals from the RF input ports 110_1-110_M, respectively, to generate a plurality of noise-cancelled signals to the output terminals 122_1-122_N. Then, the mixers 130 mix the noise-cancelled signals with local oscillation signals to generate a plurality of down-converted signals, respectively, to the following base-band circuits. In this embodiment, each of the LNAs 124_1-124_M is allowed to generate N noise-cancelled signals to the output terminals 122_1-122_N; and in practice, a portion of the LNAs is/are controlled to generate one or more noise-cancelled signals, and any one output terminals of the LNA module receives the corresponding noise-cancelled signal from only one of the LNAs 124_1-124_M. In other words, the LNA module 120 can be regarded as a RF multiplexer, which can pass the selected input signals to the mixers 130 by controlling the LNAs 124_1-124_M.

Figure 2:
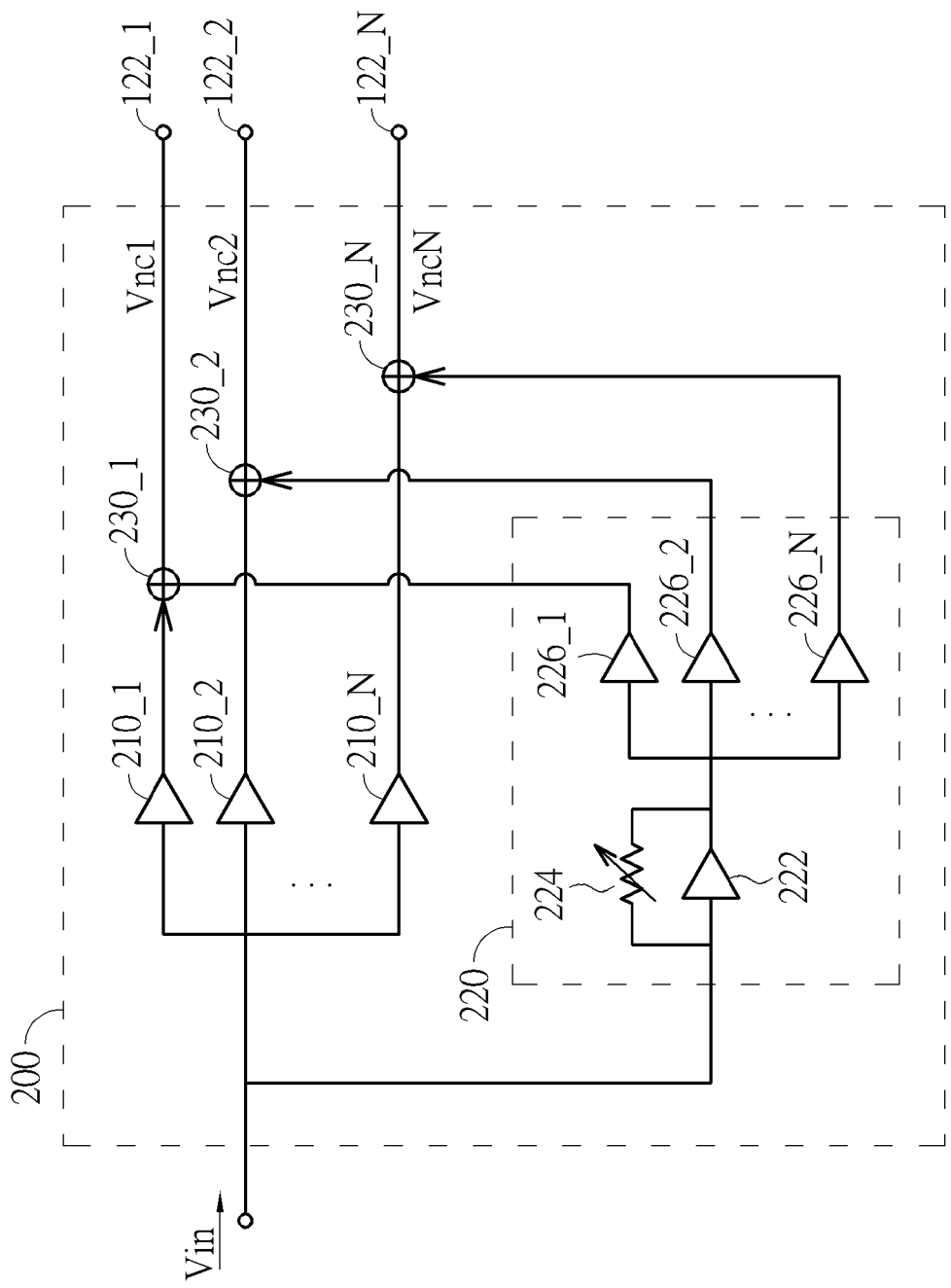
FIG. 2 is a diagram illustrating a LNA according to one embodiment of the present invention.

FIG. 2 is a diagram illustrating a LNA 200 according to one embodiment of the present invention, where the LNA 200 can be used in at least a portion of the LNA 124_1-124_M shown in FIG. 1. As shown in FIG. 2, the LNA 200 comprises a plurality of main amplifiers 210_1-210_N, a matching circuit 220 and a plurality of combiner 230_1-230_N, where the matching circuit 220 comprises a matching amplifier 222, a variable resistor 224 positioned in a feedback path of the matching amplifier 220 and a plurality of buffers 226_1-226_N (e.g. unity gain amplifiers, source followers). In the operations of the LNA 200, each of the main amplifiers 210_1-210_N is selectively enabled to receive an input signal Vin from one of the RF input ports 110_1-110_M to generate an amplified signal. The matching amplifier 220 is used to provide input matching (e.g. 50 ohm) and further to receive the input signal Vin, and the buffers 226_1-226_N buffers an output of the matching amplifier 222 to generate a plurality of outputs of the matching amplifier 220. Then, the combiners 230_1-230_N combine the amplified signals and the outputs of the matching circuit 200 to generate a plurality of noise-cancelled-signals Vnc1-VncN to the output terminals 122_1-122_N, respectively.

In detail, when the LNA 200 is controlled to pass the input signal Vin to all the output terminals 122_1-122_N of the LNA module 120, all the main amplifiers 210_1-210_N are enabled to generate N amplified signals, and all the buffers 226_1-226_N are enabled to generate N outputs (i.e. with inverted noise signal), and the combiners 230_1-230_N combine the N amplified signals and N outputs of the buffers 226_1-226_N to generate the noise-cancelled signals Vnc1-VncN, respectively. When the LNA 200 is controlled to pass the input signal Vin to one output terminal 122_1 only, the main amplifier 210_1 is enabled to generate the amplified signal while the other main amplifiers are disabled, and the buffer 226_1 is enabled to generate the output (i.e. with inverted noise signal) while the other buffers are disabled, and the combiner 230_1 combines the amplified signal of the main amplifier 210_1 and the output of the buffer 226_1 to generate the noise-cancelled signals Vnc1 to the output terminal 122_1. When the LNA 200 is controlled to pass the input signal Vin to the output terminals 122_1 and 122_2 only, the main amplifiers 210_1 and 210_2 are enabled to generate the amplified signals while the other main amplifiers are disabled, and the buffers 226_1 and 226_2 are enabled to generate the outputs (i.e. with inverted noise signal) while the other buffers are disabled, and the combiners 230_1 and 230_2 combine the amplified signals of the main amplifiers 210_1 and 210_2 and the outputs of the buffers 226_1 and 226_2 to generate the noise-cancelled signals Vnc1 and Vnc2, respectively. In addition, when the LNA 200 is controlled to not pass any input signal Vin to the output terminals 122_1-122_N of the LNA module 120, all the main amplifiers 210_1-210_N are disabled, and all the buffers 226_1-226_N are disabled.

In light of above, by controlling the main amplifiers 210_1-210_N, the LNA 200 can flexibly pass the input signal Vin to one or more of the output terminals 122_1-122_N for further processing (i.e. down conversion performed by the mixers 130), or not pass the input signal Vin to any one of the output terminals 122_1-122_N. Therefore, referring back to FIG. 1, the LNA module 120 can selectively pass any input signal to any output terminal by controlling internal elements of the LNAs 124_1-124_M, that is, the receiver 100 can support many different signal modes such as the intra-band continuous/non-contiguous carrier aggregation and inter-band carrier aggregation for LTE.

The existence of the matching circuit 220 may induce noise to the input signal Vin and the amplified signals of the main amplifiers 210_1-210_N, therefore, the design of the matching amplifier 222 with the variable resistor 224 can generate the output whose noise is opposite to the noise carried on the amplified signals (i.e. the phases of the noises on the output of the matching amplifier 222 and the amplified signals of the main amplifiers 210_1-210_N are inverted), thereby the noise caused by the matching circuit 220 can be removed from the amplified signals by using the combiners 230_1-230_N to generate the noise-cancelled signals Vnc1-VncN.

In addition, the aforementioned amplified signals of the main amplifiers 210_1-210_N and the outputs of the matching circuit 220 can be voltage signals or current signals. When the amplified signals are voltage signals, the combiners 230_1-230_N can be implemented by a voltage summer amplifier; and when the amplified signals are current signals, the combiners 230_1-230_N can be implemented by a node or a current summer for summing the amplified signal and the corresponding output of the matching circuit 220.

Figure 3:
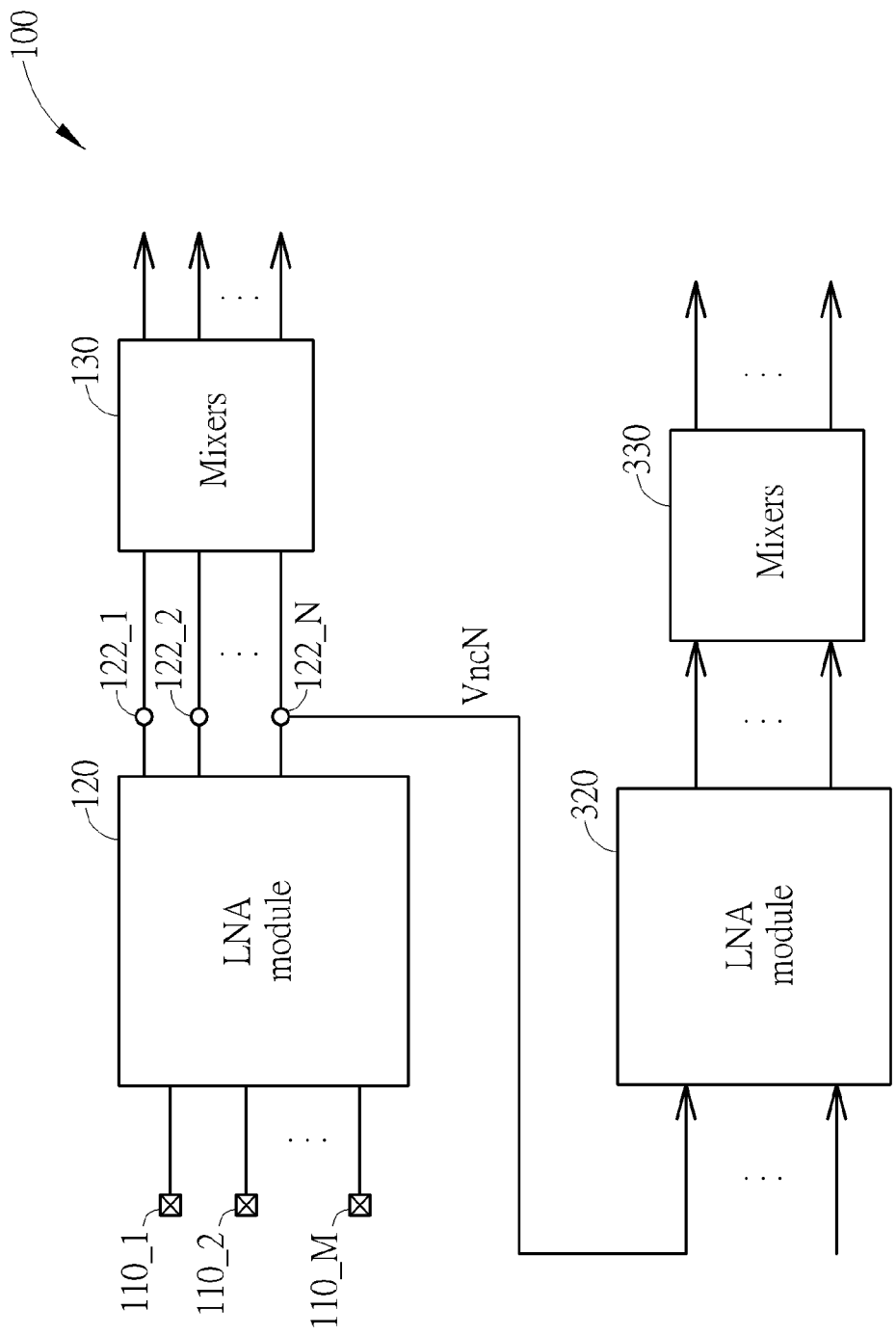
FIG. 3 shows that the receiver further comprises another LNA module and mixers according to a first embodiment of the present invention.
Figure 4:
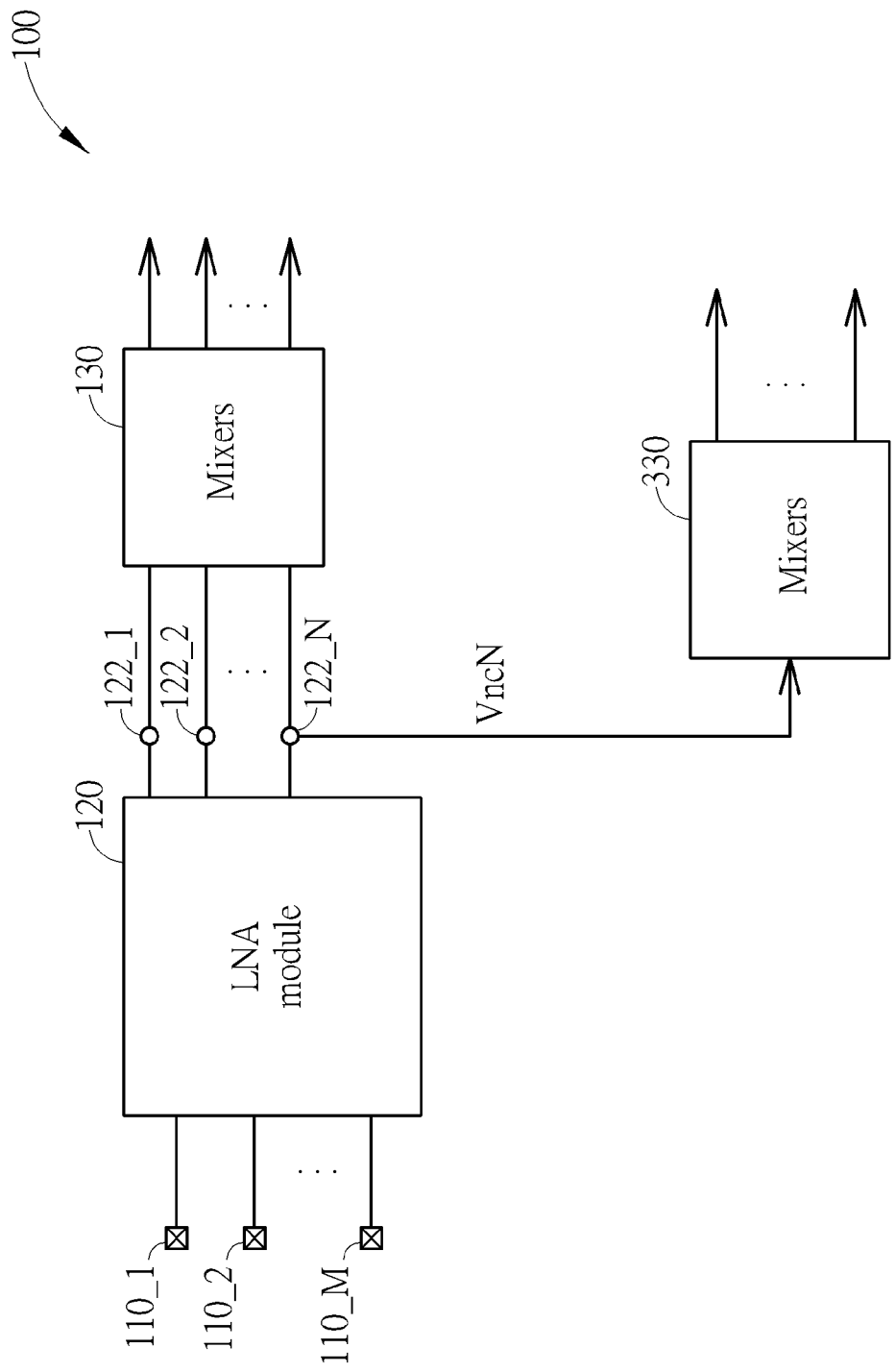
FIG. 4 shows that the receiver further comprises another mixer according to a second embodiment of the present invention.

In addition, to add more flexibility if all baseband circuits are occupied or any processing cannot be supported in the receiver 100, one or more noise-cancelled signals Vnc1-VncN can be further forwarded to another chip for further processing. For example, FIG. 3 shows that the receiver 100 further comprises a LNA module 320 and mixers 330, where the LNA module 120 and the mixers 330 are positioned in different chips. As shown in FIG. 3, the output terminal 122_N of the LNA module 120 is connected to an input terminal of the LNA module 320, and the noise-cancelled signal VncN of the LNA module 120 is selectively forwarded to the other LNA module 320 or not. Alternatively, as shown in FIG. 4, the output terminal 122_N of the LNA module 120 can be directly connected to an input terminal of mixers 330, and the noise-cancelled signal VncN of the LNA module 120 is selectively forwarded to the other mixers 330 or not. In detail, when the baseband circuits of the chip comprising the LNA module 120 and the mixers 130 are occupied or any processing cannot be supported, e.g. no local oscillation signal for desired channel, the mixers 130 will not process the noise-cancelled signal VncN, and the noise-cancelled signal VncN is forwarded to the LNA module 320 or the mixers 330 on another chip. Then, the LNA module 320 amplifies or directly passes the noise-cancelled signal VncN to the mixers 330 to generate the down-converted signal to the following base-band circuit.

Figure 5:
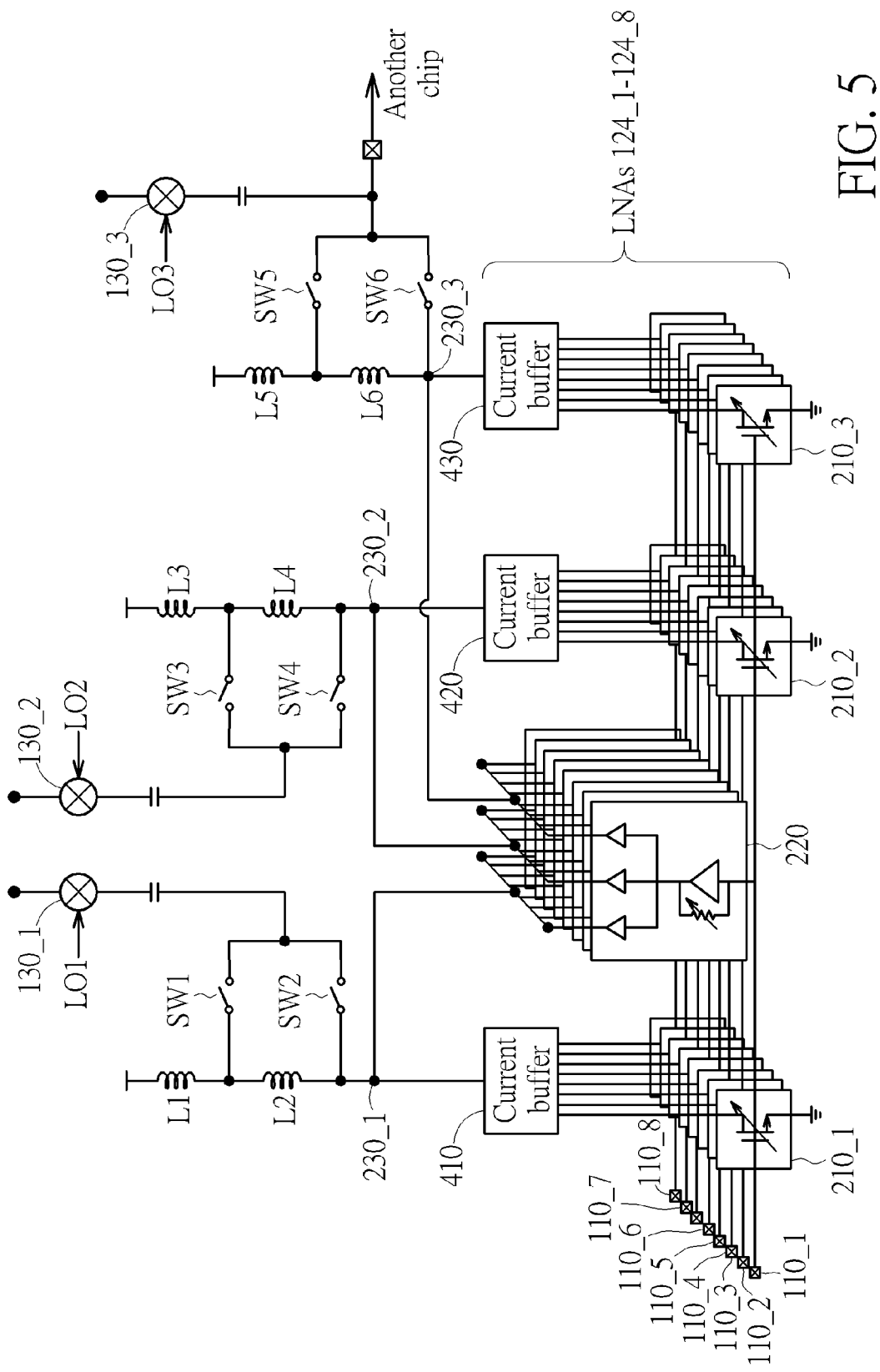
FIG. 5 is a diagram illustrating detail structure of the receiver according to one embodiment of the present invention.

FIG. 5 is a diagram illustrating detail structure of the receiver 100 according to one embodiment of the present invention, where the quantity of the LNAs is eight and the quantity of output terminals of the LNA module 120 is three, that is, M is equal to 8 and N is equal to 3. As shown in FIG. 5, only one of the main amplifiers 210_1 of the LNAs 124_1-124_8 is controlled to generate the amplified signal to a current buffer 410, and the combiner 230_1 combines the amplified signal from the current buffer 410 and the output of the matching circuit 220 to generate the noise-cancelled signal; then, by switching on one of switches SW1 and SW2, the noise-cancelled signal is inputted to the mixer 130_1 via the switch SW2 or via the inductor L2 and the switch SW1, wherein the inductor L2 serves as a gain booster by means of series inductor peaking technique when the switch SW1 is on; then, the mixer 130_1 mixes the noise-cancelled signal with a local oscillation signal LO1 to generate a down-converted signal. Similarly, only one of the main amplifiers 210_2 of the LNAs 124_1-124_8 is controlled to generate the amplified signal to a current buffer 420, and the combiner 230_2 combines the amplified signal from the current buffer 420 and the output of the matching circuit 220 to generate the noise-cancelled signal; then, by switching on one of switches SW3 and SW4, the noise-cancelled signal is inputted to the mixer 130_2 via the switch SW4 or via the inductor L4 and the switch SW3, wherein the inductor L4 serves as a gain booster when the switch SW3 is on; then, the mixer 130_2 mixes the noise-cancelled signal with a local oscillation signal LO2 to generate a down-converted signal. Similarly, only one of the main amplifiers 210_3 of the LNAs 124_1-124_8 is controlled to generate the amplified signal to a current buffer 430, and the combiner 230_3 combines the amplified signal from the current buffer 430 and the output of the matching circuit 220 to generate the noise-cancelled signal; then, by switching on one of switches SW5 and SW6, the noise-cancelled signal is inputted to the mixer 130_3 via the switch SW6 or via the inductor L6 and the switch SW5, wherein the inductor L6 serves as a gain booster when the switch SW5 is on; then, the mixer 130_3 mixes the noise-cancelled signal with a local oscillation signal LO3 to generate a down-converted signal, or the noise-cancelled signal is forwarded to another chip. It should be noted that present invention re-uses a portion of LNA spiral inductor load as series peaking inductor (L2, L4, L6) to save chip area.

Briefly summarized, in the receiver of the present invention, the LNA module can flexibly amplify selected RF input signals and pass the amplified RF input signals into following mixers, and a plurality of noise-cancellation path is used to cancel some portion of noise upon the amplified RF signals. Hence, the receiver can support all different carrier aggregation modes and the signal quality of all RF signal paths can be further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver, comprising:
a low-noise amplifier (LNA) module comprising a plurality of LNAs, wherein the LNAs are arranged to receive input signals from a plurality of input ports, respectively, and each of the LNAs generates and outputs a plurality of noise-cancelled signals at a plurality of output terminals of the LNA module;
wherein each of the LNAs comprises:
a plurality of main amplifiers, wherein each of the main amplifiers is selectively enabled to receive the input signal corresponding to the LNA to generate an amplified signal; and
a matching circuit, for providing input matching and further receiving the input signal corresponding to the LNA;
wherein an output of the matching circuit is coupled to the amplified signal(s) generated by the enabled main amplifier(s) to generate the corresponding noise-cancelled signal(s).

2. The receiver of claim 1, wherein a first LNA of the LNAs is controlled to generate a plurality of first noise-cancelled signals, and outputs the plurality of first noise-cancelled signals at the plurality of output terminals of the LNA module.

3. The receiver of claim 2, wherein a second LNA of the LNAs is controlled to generate a plurality of second noise-cancelled signals, and outputs the plurality of second noise-cancelled signals at the plurality of output terminals of the LNA module.

4. The receiver of claim 3, wherein a first output terminal of the plurality of output terminals receives at least one of the first noise-cancelled signals and at least one of the second noise-cancelled signals.

5. The receiver of claim 1, wherein each of the LNAs further comprises:
a plurality of combiners, respectively coupled to the main amplifiers, wherein each of the combiners is arranged to combine the corresponding amplified signal, if any, with the output of the matching circuit to generate the corresponding noise-cancelled signal.

6. The receiver of claim 5, wherein the matching circuit comprises:
a matching amplifier, for receiving the input signal corresponding to the LNA; and
a resistor, positioned on a feedback path of the matching amplifier.

7. The receiver of claim 6, wherein the matching circuit further comprises:
a plurality of buffer amplifiers, for receiving an output of the matching amplifier to generate a plurality of outputs of the matching circuit to the combiners, respectively.

8. The receiver of claim 1, wherein quantity of the LNAs is greater than quantity of the output terminals of the LNA module.

9. The receiver of claim 1, wherein the receiver further comprises:
a plurality of mixers, coupled to the output terminals of the LNA module, for mixing the noise-cancelled signals with local oscillation signals to generate a plurality of down-converted signals, respectively;
wherein the LNA module and the plurality of mixers are positioned in a chip, and one or more noise-cancelled signals is/are further allowed to be forwarded to other mixers within another chip.

10. A low-noise amplifier (LNA) module of a receiver, comprising:
a plurality of LNAs, wherein the LNAs are arranged to receive input signals from a plurality of input ports, respectively, and each of the LNAs generates and outputs a plurality of noise-cancelled signals at a plurality of output terminals of the LNA module;
wherein each of the LNAs comprises:
a plurality of main amplifiers, wherein each of the main amplifiers is selectively enabled to receive the input signal corresponding to the LNA to generate an amplified signal; and
a matching circuit, for providing input matching and further receiving the input signal corresponding to the LNA;
wherein an output of the matching circuit is coupled to the amplified signal(s) generated by the enabled main amplifier(s) to generate the corresponding noise-cancelled signal(s).

11. The LNA module of claim 10, wherein a first LNA of the LNAs is controlled to generate a plurality of first noise-cancelled signals, and outputs the plurality of first noise-cancelled signals at the plurality of output terminals of the LNA module.

12. The LNA module of claim 11, wherein a second LNA of the LNAs is controlled to generate a plurality of second noise-cancelled signals, and outputs the plurality of second noise-cancelled signals at the plurality of output terminals of the LNA module.

13. The LNA module of claim 12, wherein a first output terminal of the plurality of output terminals receives at least one of the first noise-cancelled signals and at least one of the second noise-cancelled signals.

14. The LNA module of claim 10, wherein each of the LNAs further comprises:
   a plurality of combiners, respectively coupled to the main amplifiers, wherein each of the combiners is arranged to combine the corresponding amplified signal, if any, with the output of the matching circuit to generate the corresponding noise-cancelled signal.

15. The LNA module of claim 14, wherein the matching circuit comprises:
   a matching amplifier, for receiving the input signal corresponding to the LNA; and
   a resistor, positioned on a feedback path of the matching amplifier.

16. The LNA module of claim 15, wherein the matching circuit further comprises:
   a plurality of buffer amplifiers, for receiving an output of the matching amplifier to generate a plurality of outputs of the matching circuit to the combiners, respectively.

17. The LNA module of claim 10, wherein quantity of the LNAs is greater than quantity of the output terminals of the LNA module.

18. The LNA module of claim 10, wherein the plurality of noise-cancelled signals are outputted to a plurality of mixers, the LNA module and the plurality of mixers are positioned in a chip, and one or more noise-cancelled signals is/are allowed to be forwarded to other mixers within another chip.

19. A low-noise amplifier for receiving an input signal to generate a plurality of noise-cancelled signals, comprising:
   a plurality of main amplifiers, wherein each of the main amplifiers is selectively enabled to receive the input signal to generate an amplified signal;
   a matching circuit, for providing input matching and further receiving the input signal; and
   a plurality of combiners, respectively coupled to the main amplifiers, wherein each of the combiners is arranged to combine the corresponding amplified signal, if any, with an output of the matching circuit to generate the corresponding noise-cancelled signal.

20. The low-noise amplifier of claim 19, wherein the matching circuit comprises:
   a matching amplifier, for receiving the input signal; and
   a resistor, positioned on a feedback path of the matching amplifier.

21. The low-noise amplifier of claim 20, wherein the matching circuit further comprises:
   a plurality of buffer amplifiers, for receiving an output of the matching amplifier to generate a plurality of outputs of the matching circuit to the combiners, respectively.

* * * * *